US008168882B2

(12) United States Patent
Lim et al.

(10) Patent No.: US 8,168,882 B2
(45) Date of Patent: *May 1, 2012

(54) INTEGRATED THIN-FILM SOLAR CELL AND METHOD OF MANUFACTURING THE SAME

(75) Inventors: Koeng Su Lim, Daejeon (KR); Seong Won Kwon, Daegu (KR); Joong Hwan Kwak, Seoul (KR); Ji Hwan Yang, Jeollanam-do (KR); Sang Il Park, Chungbuk (KR); Sang Hwan Kim, Seoul (KR); Yoo Jin Lee, Gyeonggi-do (KR); Jin Koog Shin, Seoul (KR)

(73) Assignee: Korea Advanced Institute of Science & Technology, Daejeon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/568,360

(22) Filed: Sep. 28, 2009

(65) Prior Publication Data
US 2010/0018574 A1    Jan. 28, 2010

Related U.S. Application Data

(62) Division of application No. 11/610,254, filed on Dec. 13, 2006.

(30) Foreign Application Priority Data

Dec. 14, 2005 (KR) .................. 10-2005-0123337

(51) Int. Cl.
*H01L 25/00* (2006.01)
*H01L 31/00* (2006.01)
*H01L 31/042* (2006.01)
*H01L 21/00* (2006.01)
*H02N 6/00* (2006.01)

(52) U.S. Cl. ........ 136/244; 136/243; 136/249; 136/256; 438/19

(58) Field of Classification Search .................. 136/256, 136/243–244, 249; 438/19
See application file for complete search history.

(56) References Cited

U.S. PATENT DOCUMENTS 3,994,012 A    11/1976 Warner, Jr.
(Continued)

FOREIGN PATENT DOCUMENTS

CN    1498426 A    5/2004
(Continued)

OTHER PUBLICATIONS

Non-Final Office Action issued for U.S. Appl. No. 11/610,254, filed Dec. 13, 2006, Mailed on Sep. 16, 2009, 26 pages.
(Continued)

*Primary Examiner* — Basia Ridley
*Assistant Examiner* — Lindsey Bernier
(74) *Attorney, Agent, or Firm* — Foley & Lardner LLP

(57) ABSTRACT

Provided are an integrated thin-film solar cell and a method of manufacturing the same. The method comprises forming and patterning a conductive material to be adjacently spaced a predetermined distance apart from each other on a substrate; forming a solar cell (semiconductor) layer on the resultant substrate; obliquely depositing a first transparent conductive material on the solar cell layer; etching the solar cell layer using the first transparent conductive material as a mask; and obliquely depositing a second transparent conductive material on the resultant substrate, and electrically connecting the conductive material with the first transparent conductive material.

12 Claims, 11 Drawing Sheets

U.S. PATENT DOCUMENTS

| | | | |
|---|---|---|---|
| 4,200,472 | A | 4/1980 | Chappell et al. |
| 4,501,636 | A | 2/1985 | Valley |
| 4,514,582 | A | 4/1985 | Tiedje et al. |
| 4,631,351 | A | 12/1986 | Tawada et al. |
| 4,740,431 | A | 4/1988 | Little |
| 4,758,526 | A | 7/1988 | Thalheimer |
| 5,421,908 | A | 6/1995 | Yoshida et al. |
| 6,168,968 | B1 | 1/2001 | Umemoto et al. |
| 6,172,297 | B1 | 1/2001 | Hezel et al. |
| 6,207,890 | B1 | 3/2001 | Nakai et al. |
| 6,299,785 | B1 | 10/2001 | Shimokawa et al. |
| 6,423,567 | B1 | 7/2002 | Ludemann et al. |
| 7,019,207 | B2 | 3/2006 | Harneit et al. |
| 7,355,114 | B2 | 4/2008 | Ojima et al. |
| 7,615,391 | B2 | 11/2009 | Ojima et al. |
| 7,927,497 | B2 * | 4/2011 | Lim et al. ............ 216/24 |
| 2003/0121542 | A1 | 7/2003 | Harneit et al. |
| 2004/0035460 | A1 | 2/2004 | Gonsiorawski |
| 2004/0050816 | A1 | 3/2004 | Asakawa et al. |
| 2004/0118444 | A1 * | 6/2004 | Duggal et al. ............ 136/244 |
| 2004/0123897 | A1 | 7/2004 | Ojima et al. |
| 2004/0187916 | A1 | 9/2004 | Hezel |
| 2007/0131271 | A1 * | 6/2007 | Lim et al. ............ 136/244 |
| 2007/0131272 | A1 | 6/2007 | Lim et al. |
| 2008/0216890 | A1 | 9/2008 | Lim |
| 2010/0012173 | A1 * | 1/2010 | Kwon et al. ............ 136/252 |
| 2010/0300525 | A1 * | 12/2010 | Lim et al. ............ 136/256 |
| 2011/0030777 | A1 * | 2/2011 | Lim et al. ............ 136/256 |

FOREIGN PATENT DOCUMENTS

| | | |
|---|---|---|
| EP | 1 583 155 | 10/2005 |
| JP | 61-035573 | 2/1986 |
| JP | 63-042180 | 2/1988 |
| JP | 07-202229 | 8/1995 |
| JP | 08-274360 | 10/1996 |
| JP | 11-026793 | 1/1999 |
| JP | 11-097723 | 4/1999 |
| JP | 11-312860 | 11/1999 |
| KR | 2002-0005152 | 1/2002 |
| WO | WO-02/059981 A2 | 8/2002 |
| WO | WO 2006/107154 A1 | 10/2006 |

OTHER PUBLICATIONS

Ahmed, Shamim; Non-final Office Action on U.S. Appl. No. 11/610,366 mailed Apr. 15, 2010; 15 pages.; US Patent and Trademark Office.

Bernier, Lindsey A.; Non-final Office Action on U.S. Appl. No. 12/568,370 mailed May 11, 2010; 16 pages.; U.S. Patent and Trademark Office.

Bernier, Linesey A.; Office Action on U.S. Appl. No. 11/610,254 mailed May 26, 2010; 30 pages.; US Patent and Trademark Office.

Olsen, Allan W.; Non-final office action on U.S. Appl. No. 11/908,826 mailed Apr. 14, 2010; 11 pages.; US Patent and Trademark Office.

USPTO Office Action on U.S. Appl. No. 11/610,366 mailed Nov. 9, 2010; 16 pages.

USPTO Final Office Action on U.S. Appl. No. 12/568,370 dated Jan. 19, 2011; 15 pages.

USPTO Non-final Office Action on U.S. Appl. No. 11/610,254 dated Jan. 19, 2011; 16 pages.

USPTO Final Office Action on U.S. Appl. No. 11/610,254 dated Jul. 6, 2011; 12 pages.

USPTO Office Action on U.S. Appl. No. 12/568,370 dated Jul. 6, 2011; 10 pages.

* cited by examiner

FIG. 1 PRIOR ART
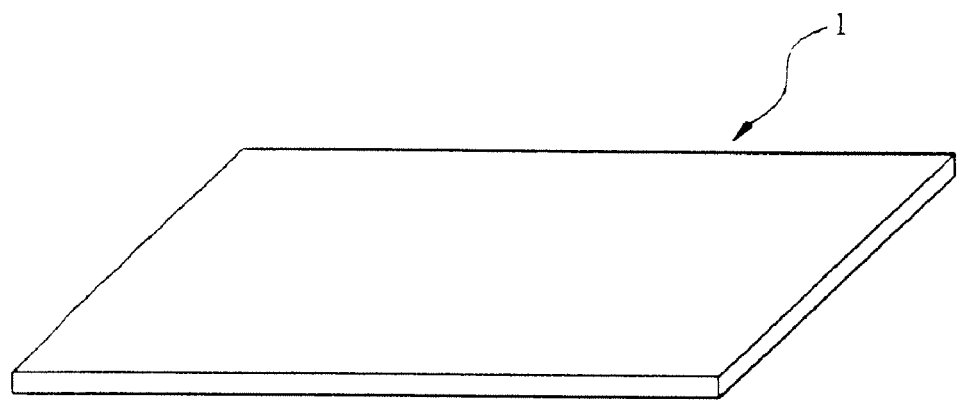
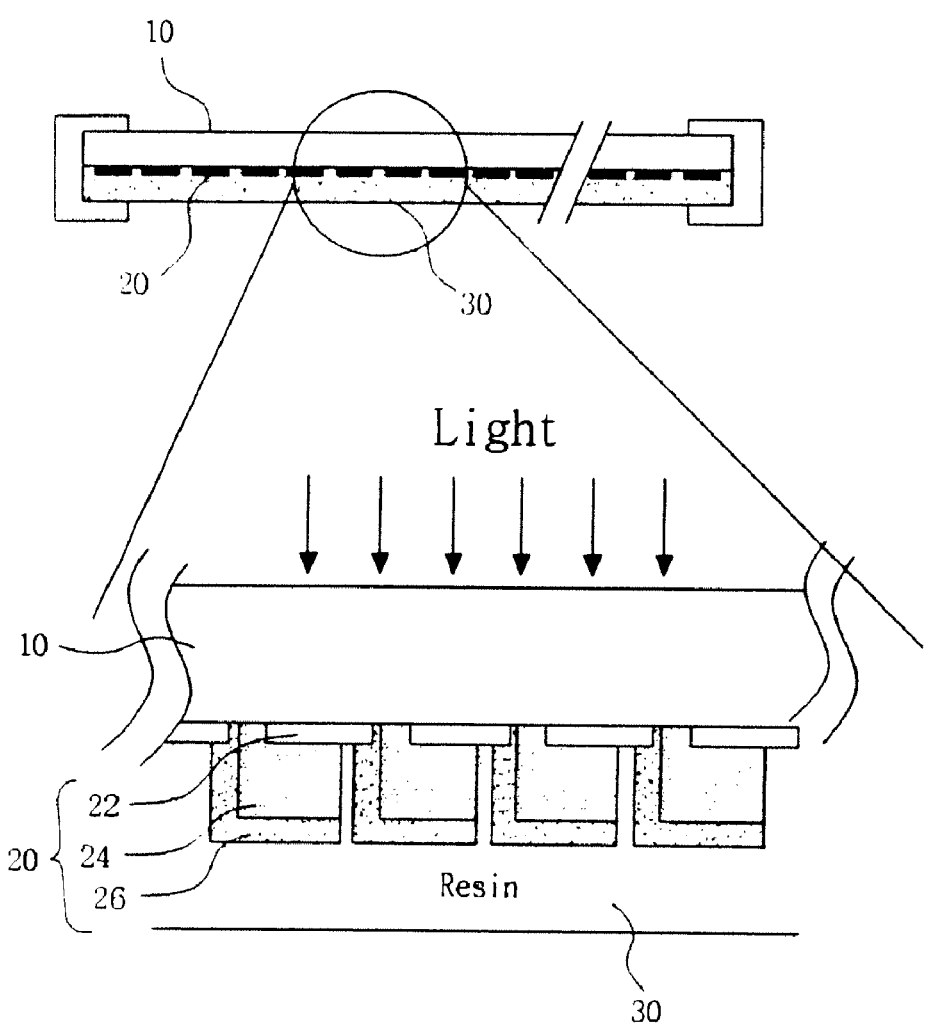

FIG. 2 PRIOR ART
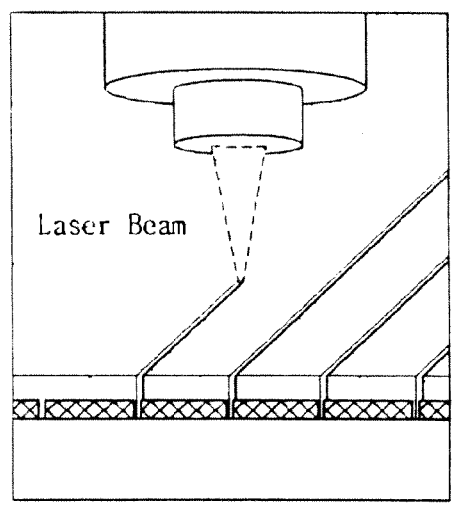
FIG. 3
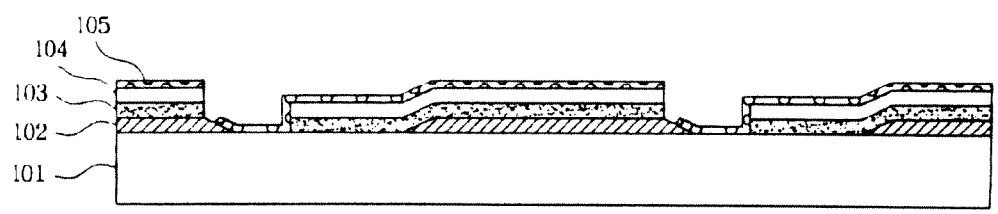
FIG. 4
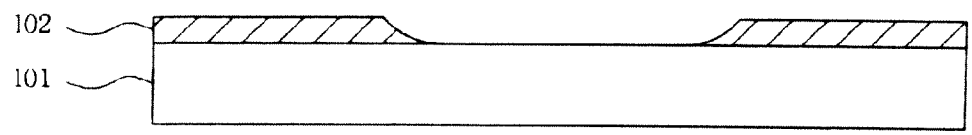

INTEGRATED THIN-FILM SOLAR CELL AND METHOD OF MANUFACTURING THE SAME

This application is a division of application Ser. No. 11/610,254, filed Dec. 13, 2006, now pending, and related to a concurrently filed application entitled INTEGRATED THIN-FILM SOLAR CELL AND METHOD OF MANUFACTURING THE SAME. Ser. No. 12/568,370 filed Sep. 28, 2009, and based on Korean Patent Application No. 10-2005-0123337 filed Dec. 14, 2005, by Koeng Su Lim, Seong Won Kwon, Joong Hwan Kwak, Sang Il Park, Ji Hwan Yang, Sang Hwan Kim, Yoo Jin Lee, and Jin Koog Shin, which are incorporated herein by reference in their entirety. This application claims only subject matter disclosed in the parent application and therefore presents no new matter.

BACKGROUND OF THE INVENTION

1. Technical Field of the Invention

The present invention relates to an integrated thin-film solar cell, and more particularly, to an integrated thin-film solar cell minimizing its loss incurred in a manufacture process and achieved even by a cheap process, and a method of manufacturing the same.

2. Description of the Background Art

Solar cell refers to a semiconductor device for directly converting solar energy into electricity. The solar cell can be mainly classified into a silicon-based solar cell, a compound-based solar cell, and an organic solar cell depending on its use material.

The silicon-based solar cell is in detail classified into a single crystalline silicon solar cell, a polycrystalline silicon solar cell, and an amorphous silicon solar cell depending on a semiconductor phase.

The solar cell is classified into a bulk (substrate) solar cell and a thin film solar cell depending on a semiconductor thickness. In the thin film solar cell, a semiconductor layer has a thickness of to several μm to several tens of μm.

In the silicon-based solar cell, the single crystalline and polycrystalline silicon solar cells belong to the bulk solar cell. The amorphous silicon solar cell belongs to the thin film solar cell.

The compound-based solar cell is classified into the bulk solar cell based on gallium arsenide (GaAs) and indium phosphide (InP) of groups III-V, and the thin film solar cell based on cadmium telluride (CdTe) of groups II-VI and copper indium diselenide (CIS) ($CuInSe_2$) of groups I-III-VI. The organic solar cell is mainly classified into an organic molecular solar cell and an organic/inorganic complex solar cell. In addition, there is a dye-sensitized solar cell. They all belong to the thin film solar cell.

Among several kinds of solar cells, the bulk silicon solar cell having a high-energy conversion efficiency and a cheap manufacturing cost is being popularly utilized for ground power.

In recent years, there is a trend in which a raw material increases in price because of its shortage as a demand for the bulk silicon solar cell suddenly increases. A thin film solar cell whose silicon raw material can reduce by one several hundredth of the present time is being greatly required for the development of a technology for low pricing and mass production of a solar cell for massive ground power.

FIG. 1 is a diagram illustrating a structure of a conventional integrated thin-film solar cell. FIG. 2 is a diagram illustrating an example of a laser patterning process for machining a transparent electrode, a solar cell (semiconductor) layer, a metal back electrode in a conventional integrated thin-film solar cell.

As shown in FIG. 1, a conventional integrated thin-film solar cell 1 is of a structure in which a plurality of unit cells 20 are connected in series and integrated on a glass substrate or transparent plastic substrate 10 (hereinafter, referred to as "transparent substrate").

The integrated thin-film solar cell includes a transparent electrode 22 mutually cut (insulated), and formed in a band shape on the transparent substrate 10 that is an insulator; a unit solar cell (semiconductor) layer 24 covering the transparent electrode 22 and formed in a band shape; and a metal back electrode layer 26 covering the solar cell layer 24 and formed in a band shape. The integrated thin-film solar cell is of a structure in which the plurality of cut (insulated) unit cells 20 connect in series with each other. The metal back electrode is covered with a back protective layer 30 formed of resin for preventing electrical short-circuiting of the solar cell and protecting the solar cell.

In general, a laser patterning method, a chemical vaporization machining (CVM) method, a metal probe-based mechanical scribing method are being used to manufacture the integrated thin-film solar cell 1.

The laser patterning method refers to a technology for etching the transparent electrode 22, the solar cell (semiconductor) layer 24, and the metal back electrode layer 26, mainly using YAG laser beam. A detailed usage method will be described as follows.

As shown in FIG. 2, the transparent electrode 22 is formed on the transparent substrate 10, and is etched using laser beam under the atmosphere. After that, the solar cell (semiconductor) layer 24 is formed and is cut (insulated) using the laser beam under the atmosphere. The metal back electrode layer 26 is formed and is etched using the laser patterning process under the atmosphere, thereby electrically connecting the solar cells in series and forming the integrated solar cell.

A drawback of the laser patterning method will be described below.

As shown in FIG. 2, the transparent electrode 22 is formed on an entire upper surface of the transparent substrate 10. After that, the transparent electrode 22 is cut in the laser patterning method, and is cut (insulated) in the band shape having a predetermined width. Then, the cut transparent electrode 22 has a width of 50 μm to several 100 μm in general.

After that, a process of forming the solar cell (semiconductor) layer 24 is performed mostly under vacuum whereas the laser patterning for cutting the solar cell (semiconductor) layer 24 is performed under the atmosphere. This makes it impossible to perform a sequential process under the vacuum, thereby deteriorating an operation efficiency of a manufacturing device. This inevitably results in a price increase for the solar cell. Also, there is a drawback that the solar cell is deteriorated in characteristic due to adherence of moisture and a contaminant because the substrate is exposed to the atmosphere to etch the solar cell layer 10.

Next, the metal back electrode layer 26 is formed under the vacuum by a sputtering method and is again laser-patterned under the atmosphere, thereby manufacturing the integrated solar cell. This process can cause process discontinuity and contaminant drawbacks as described above. An ineffective area (cut width) between the unit cells 20 of the solar cell increases through a total of three-times laser patterning including two times of laser patterning for cutting the transparent electrode 22 and the solar cell (semiconductor) layer 24, and one time of laser patterning for cutting the metal back electrode layer 26 and concurrently electrically connecting the solar cells in series. Thus, a loss of an effective area of the solar cell increases. There is a drawback that a laser patterning equipment is expensive, and a precision position control system is required for patterning at an accurate position, thereby increasing a manufacturing cost.

The chemical vaporization machining method refers to a technology for simultaneously cutting the solar cell (semiconductor) layer into the plurality of unit cells having a uniform width, by locally generating atmospheric pressure plasma around line electrodes that have diameters of tens of μm and are arranged in a grid form in proximity to an upper portion of a substrate, using $SF_6$/He gas.

The chemical vaporization machining method has a feature of short process time, excellent film selectivity, and less film damage compared with the laser patterning method. The chemical vaporization machining method has an advantage of preventing a performance of the solar cell from being deteriorated by the exposure of the substrate to the atmosphere because etching is performed under the vacuum unlike the laser patterning method, and reducing the manufacturing cost compared with the laser patterning method.

However, the precision position control system capable of accurately controlling a position within a vacuum device is needed because the etching should be performed in an accurate position adaptively to the patterned transparent electrode. This is of very difficult matter when the solar cell is manufactured using a large-scale substrate. A gap obtained by the etching is about 200 μm to the minimum, and is greater than an insulation gap obtained using the laser patterning method. Thus, there is a drawback of increasing the loss of the effective area of the solar cell.

Another etching method is the mechanical scribing method. This method makes it possible to perform collective scribing, by a plurality of metal probes, correspondingly to the number of necessary unit cells, and is greater in extensibility and adaptability to high-speed processing than the laser patterning method. The mechanical scribing method refers to an etching method in which device and operation costs are most cheap compared with the above two methods.

In a CIS solar cell for example, a CdS/CIS layer is being popularly used to manufacture the CIS solar cell because it is softer than molybdenum (Mo), thereby facilitating scribing based on the scribing method.

However, the conventional mechanical scribing method has a drawback that it needs the laser patterning equipment for etching a back electrode (Mo) and a front electrode (ZnO), and the precision position control device for accurately controlling the position because it is limitedly used only for the solar cell (semiconductor) layer.

SUMMARY OF THE INVENTION

Accordingly, the present invention is to provide an integrated thin-film solar cell for reducing an insulation gap between unit elements reduces, thereby increasing an effective area of the solar cell, performing all processes under vacuum after forming a transparent electrode, and electrically connecting the unit elements of the solar cell in series by a simple process, thereby achieving its unit cell type.

Also, the present invention is to provide a method of manufacturing an integrated thin-film solar cell, for preventing deterioration of a performance of a unit cell, and reducing a manufacturing cost.

Also, the present invention is to provide a method of manufacturing an integrated thin-film solar cell, for acquiring a desired high voltage from one solar cell even while performance deterioration is as little as disregardful.

In one aspect, there is provided a method of manufacturing an integrated thin-film solar cell. The method comprises forming and patterning a first conductive material to be adjacently spaced a predetermined distance apart from each other on a substrate; forming a solar cell layer on the resultant substrate; obliquely depositing a second conductive material on the solar cell layer; etching the solar cell layer using the second conductive material as a mask; and obliquely depositing a third conductive material on the resultant substrate, and electrically connecting the first conductive material with the second conductive material adjacent to the first conductive material.

The first to third conductive material may be a transparent conductive material or a metallic material.

The transparent conductive material may be any one or more selected from the group consisting of zinc oxide (ZnO), tin oxide ($SnO_2$), and Indium Tin Oxide (ITO).

The depositing of the second transparent conductive material may further comprise forming and patterning a metal electrode to be spaced a predetermined distance apart from each other.

The forming of the conductive material further comprise thinly forming the first conductive material on the substrate; coating and forming a pattern of photoresist or polymer band to be spaced a predetermined distance apart on the first conductive material by a printing method; etching the first conductive material using the coated photoresist or polymer pattern as a mask; and removing the photoresist or polymer pattern.

The conductive material is etched in an isotropic etching method to have a curved slant section as an etching section.

The conductive material is mesa etched to have a slant section.

The conductive material is etched in an anisotropic etching method so that etching is performed in a vertical direction of the substrate.

The solar cell layer is etched in a vertical direction.

The solar cell layer is obliquely etched in a slant direction.

The substrate is a substrate with an insulating film formed on a conductive substrate, or an insulating substrate.

In another aspect, there is provided an integrated thin-film solar cell whose unit elements electrically connect in series by the above solar cell manufacturing method.

In a further another aspect, there is provided a method of manufacturing an integrated thin-film solar cell. The method comprises forming and patterning a first conductive material to be adjacently spaced a predetermined distance apart from each other on a substrate; obliquely depositing a second conductive material on the resultant substrate; forming a solar cell layer on the resultant substrate; obliquely depositing a third conductive material on the solar cell layer; etching the solar cell layer using the third conductive material as a mask; and obliquely depositing a fourth conductive material on the resultant substrate, and electrically connecting the second conductive material with the third conductive material adjacent to the second conductive material.

The first and second conductive materials may be transparent conductive materials or metallic materials.

The first to fourth conductive materials are transparent conductive materials or metallic materials.

The depositing of the second transparent conductive material further comprises: forming and patterning a metal electrode to be spaced a predetermined distance apart from each other.

The substrate is a substrate with an insulating film formed on a conductive substrate, or an insulating substrate.

In a yet another aspect, there is provided an integrated thin-film solar cell whose unit elements electrically connect in series by the above solar cell manufacturing method.

In a still another aspect, there is provided a method of manufacturing an integrated thin-film solar cell. The method comprises obliquely depositing a first conductive material on a substrate on which prominence and depression are provided and spaced a predetermined distance apart from each other; forming a solar cell layer on the resultant substrate; obliquely depositing a second conductive material on the solar cell layer; etching the solar cell layer using the second conductive material as a mask; and obliquely depositing a third conductive material on the resultant substrate, and electrically connecting the first conductive material with the second conductive material.

The first to third conductive materials are a transparent conductive material or a metallic material.

The depositing of the second transparent conductive material further comprises: forming and patterning a metal electrode to be spaced a predetermined distance apart from each other.

The substrate is a substrate with an insulating film formed on a conductive substrate, or an insulating substrate.

In a still another aspect, there is provided an integrated thin-film solar cell whose unit elements electrically connect in series by the above solar cell manufacturing method.

It is to be understood that both the foregoing general description and the following detailed description are exemplary and explanatory and are intended to provide further explanation of the invention as claimed.

BRIEF DESCRIPTION OF THE DRAWINGS

The invention will be described in detail with reference to the following drawings in which like numerals refer to like elements.

FIG. 1 is a diagram illustrating a structure of a conventional integrated thin-film solar cell;

FIG. 2 is a diagram illustrating an example of a laser patterning process for machining a transparent electrode, a solar cell (semiconductor) layer, a metal back electrode in a conventional integrated thin-film solar cell;

FIG. 3 is a cross sectional diagram illustrating a structure of an integrated thin-film solar cell formed by two slant depositions on an insulating substrate according to an exemplary embodiment of the present invention;

FIG. 4 is a cross sectional view illustrating a substrate on which a patterned conductive material is formed according to the present invention;

DETAILED DESCRIPTION OF PREFERRED EMBODIMENTS

Figure 5:
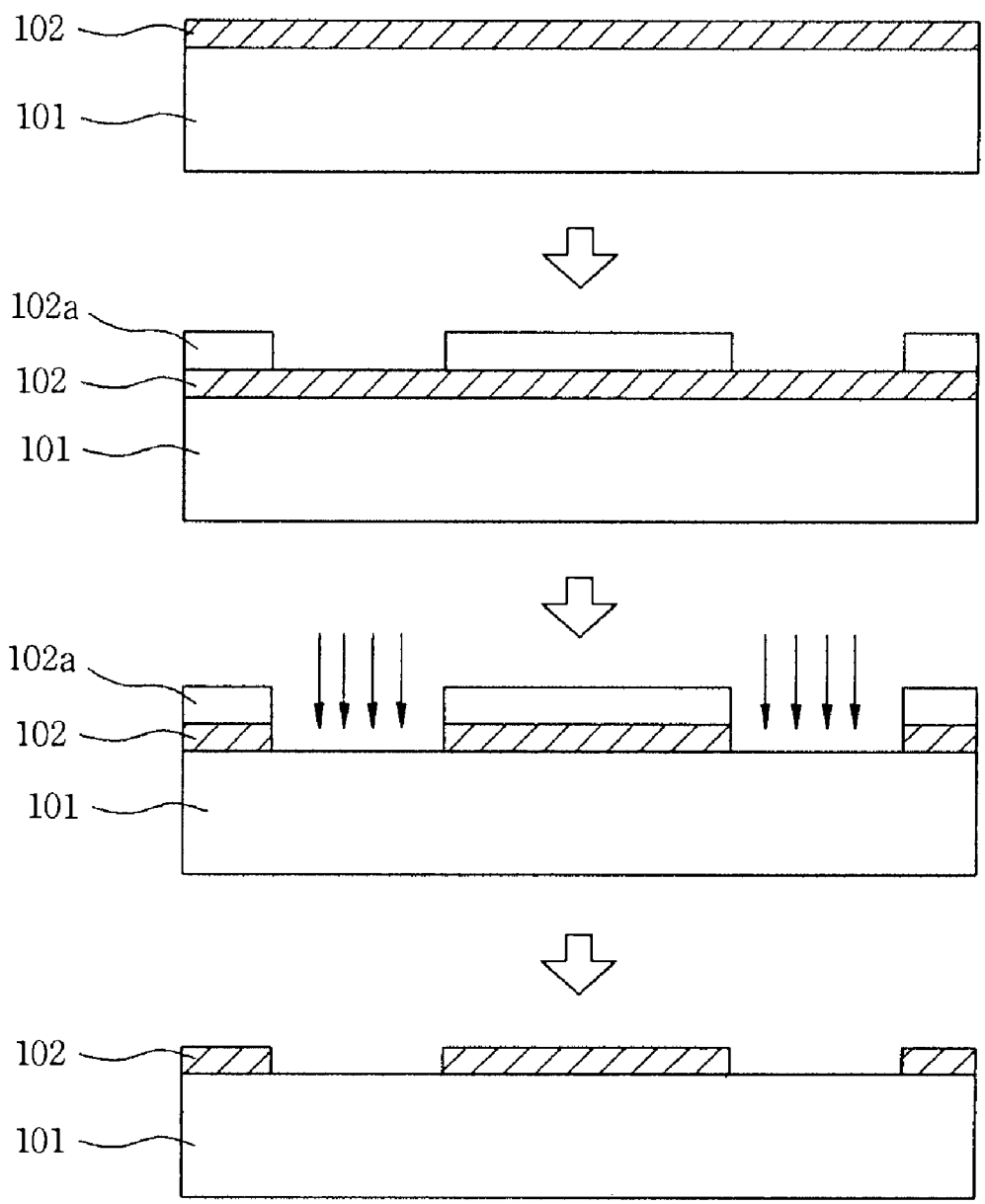
FIG. 5 is a sequential diagram illustrating a printing method for patterning the conductive material of FIG. 4.

Preferred embodiments of the present invention will be described in a more detailed manner with reference to the drawings.

In the present invention, a substrate refers to a substrate with an insulating film formed on a conductive substrate, or an insulating substrate. For description convenience, a description will be made for two cases where a substrate has a conductive property and an insulating property.

Accordingly, in claims of the present invention, the substrate comprises the substrate with the insulating film formed on the conductive substrate, and the insulating substrate. This is to employ the insulating film because the conductive substrate electrically connects with other conductive materials.

(1) Integrated Solar Cell Formed by Two Slant Depositions on Insulating Substrate.

FIG. 3 is a cross sectional diagram illustrating a structure of an integrated thin-film solar cell formed by two slant depositions on an insulating substrate 101 according to an exemplary embodiment of the present invention.

As shown in FIG. 3, the integrated thin-film solar cell according to the present invention is of a structure where a conductive material 102 having a slant section, a solar cell (semiconductor) layer 103, a first transparent conductive material 104, and a second transparent conductive material 105 are sequentially layered on the insulating substrate 101.

In other words, the conductive material 102 is patterned to have an insulating gap for insulation from left/right adjacent conductive materials 102. The solar cell (semiconductor) layer and the first transparent conductive material 104 are deposited on the patterned conductive material 102. The second transparent conductive material 105 is positioned on the first transparent conductive material 104. The second transparent conductive material 105 is of a structure in which it gets in contact with and electrically connects in series with the adjacent conductive material 102 of one direction.

As shown in FIG. 3, the patterned conductive material 102 can have a slant section with a predetermined slope at its side portion. But, this is not intended to limit the scope of the present invention and thus, the patterned conductive material 102 can have a curved slant section or a section vertical with the substrate 101.

A method of manufacturing the integrated thin-film solar cell will be described in sequence as follows.

FIGS. 4 to 10 are cross sectional diagrams sequentially illustrating a method of manufacturing the integrated solar cell according to the present invention.

FIG. 4 is a cross sectional diagram illustrating the insulating substrate 101 on which the patterned conductive material 102 is formed according to the present invention.

As shown in FIG. 4, the patterned conductive material 102 is formed on the insulating substrate 101 in a first process of the manufacturing method of the integrated thin-film solar cell according to the present invention.

The insulating substrate 101 is a transparent substrate or a non-transparent substrate. The conductive material 102 is a transparent conductive material that is any one or more selected from the group consisting of zinc oxide (ZnO), tin oxide (SnO$_2$), and Indium Tin Oxide (ITO), a single metal with a high reflectivity such as aluminum (Al), argentums (Ag), and aurum (Au), a multi metal being a mixture of aluminum (Al)/argentums (Ag), or a metallic material that is any one or more selected from the group consisting of argentums (Ag), aluminum (Al), and aurum (Au).

The patterned conductive material 102 is possible for all cases where surface prominence and depression is provided or not.

In a process of patterning the conductive material 102, as shown in FIG. 5, the conductive material 102 is thinly formed on the substrate 101, photoresist (PR) or polymer 102a is coated on the conductive material 102 by a printing method, and the photoresist or polymer 102a is coated so that the conductive material 102 is mutually spaced a predetermined distance apart by controlling a degree of viscosity of the printed photoresist or polymer 102a. After the coating, the conductive material 102 is etched using the photoresist or polymer 102a as a mask. After that, the photoresist or polymer 102a is removed.

The printing method refers to a screen printing method for coating and patterning a photoresist or polymer thin film by the simplest printing device and a simple and convenient cheap process, or a gravure press method for forming a fine pitch pattern.

Figure 6A:
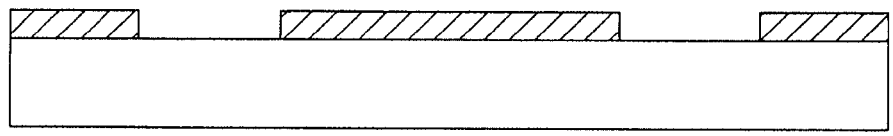
FIGS. 6A and 6B illustrate patterned conductive materials according another exemplary embodiment of the present invention.
Figure 6B:
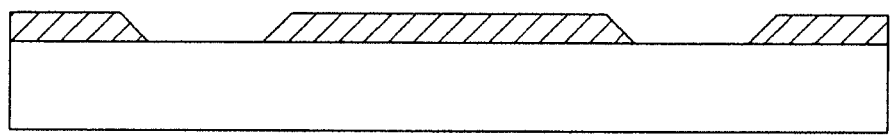

An anisotropic or isotropic etching method is used for etching the conductive material 102. In the isotropic etching method, the conductive material 102 can be patterned to have curved and slant surfaces at both sides and a width getting greater as it goes to a lower side as shown in FIG. 4. In the anisotropic etching method, the conductive material 102 can be patterned to have the section vertical with the substrate 101, or the slant section with a predetermined slope as shown in FIGS. 6A and 6B.

If each printing method is used for etching the conductive material 102 as above, high-density pattern printing is possible, a thin film has an excellent homogeneity, a process is relatively simpler, and an expensive equipment for laser patterning is not needed unlike a conventional method. Thus, a manufacturing cost can reduce.

In addition to the above-described methods for patterning the conductive material 102, there is a method of coating the photoresist using a photolithography, instead of coating the polymer using the printing method. The photolithography is based on a principle in which the photoresist leads to a chemical reaction and varies its property when receiving light.

In a printing method using a sol-gel solution containing a conductive film manufacturing raw material like an ink, a conductive material film can be directly coated on the substrate without using a photoresist or polymer pattern based on the printing method or the photolithography. The printing method makes it possible to directly form and pattern the conductive material film in a band shape in a low temperature process without the etching process using the mask.

A technology for patterning and etching the conductive material 102 has been already filed by this applicant and is assigned Korean Patent Application No. 2005-0021771 entitled "Machining Method and Structure of Transparent Electrode for Integrated thin-film solar cell, and Transparent Substrate having Transparent Electrode." Here, a transparent electrode refers to a conductive material.

Figure 7:
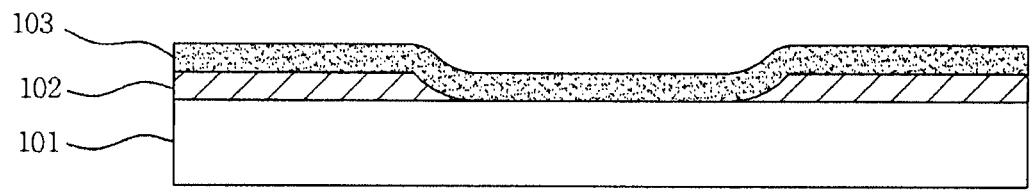
FIG. 7 is a cross sectional diagram illustrating a state where a solar cell layer is formed according to the present invention.

Referring next to FIG. 7 illustrating a cross sectional diagram of a state where the solar cell layer 103 is formed according to the present invention, the solar cell layer 103 is formed on the above patterned conductive material 102 in compliance with a surface shape of the substrate 101.

The solar cell can be any one or more of a silicon-based solar cell, a compound-based solar cell, an organic solar cell, a dry dye-sensitized solar cell, and an organic/inorganic complex solar cell.

Among them, the silicon-based solar cell is any one of an amorphous silicon (a-Si:H) single junction solar cell, an a-Si:H/a-Si:H or a-Si:H/a-Si:H/a-Si:H multi-junction solar cell, an amorphous silicon-germanium (a-SiGe:H) single junction solar cell, an a-Si:H/a-SiGe:H double junction solar cell, an a-Si:H/a-SiGe:H/a-SiGe:H triple junction solar cell, an amorphous silicon/microcrystalline (polycrystalline) silicon double junction solar cell, and a protocrystalline silicon solar cell.

Figure 8:
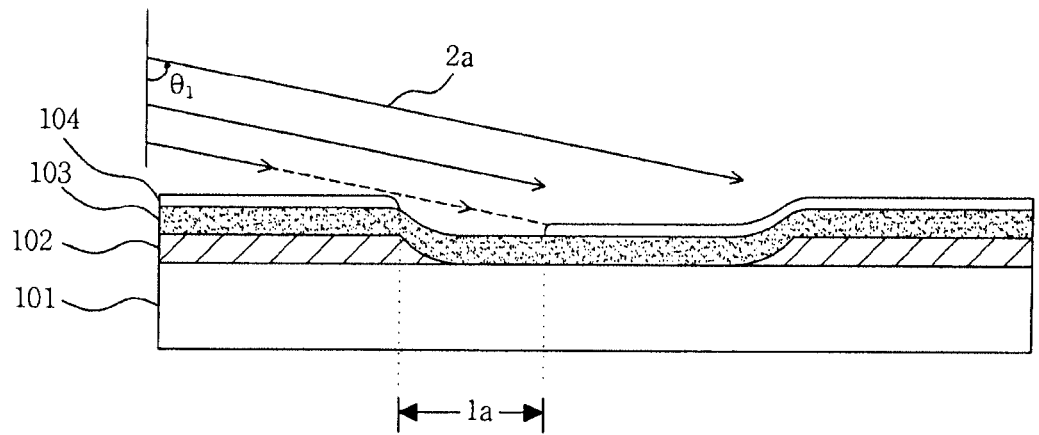
FIG. 8 is a cross sectional diagram illustrating a state where a first transparent conductive material is formed according to the present invention.

FIG. 8 is a cross sectional diagram illustrating a state where the first transparent conductive material 104 is formed according to the present invention. The first transparent conductive material 104 is obliquely deposited and formed on the above formed solar cell layer 103 using a deposition method such as electron beam or thermal deposition.

The first transparent conductive material 104 is a transparent conductive material, and is at least one selected from the group consisting of zinc oxide (ZnO), tin oxide (SnO$_2$), and Indium Tin Oxide (ITO).

Thus, when the first transparent conductive material 104 is deposited on a slant with a first angle ($\theta_1$) using an electron beam or thermal depositor, it is thinly deposited on the solar cell layer 103 excluding a portion (1a) comprising the slant surface, owing to deposition straightness (2a). The portion (1a) comprising the slant surface represents a region for etching implemented in the following step.

Figure 9A:
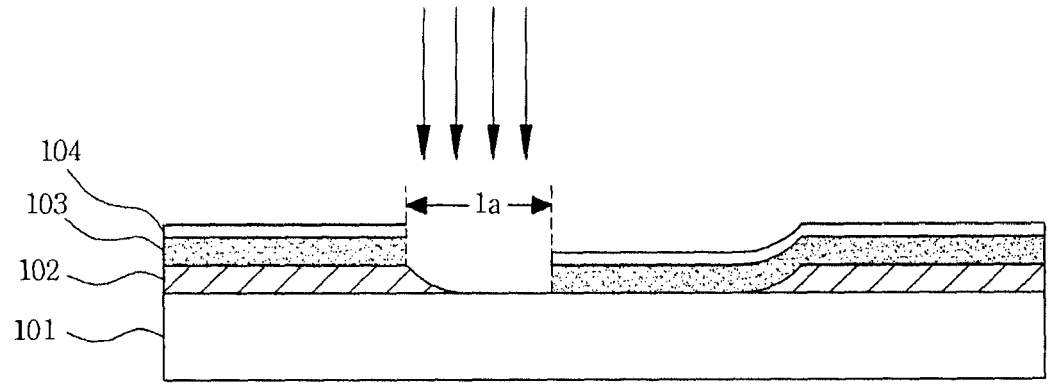
FIGS. 9A and 9B are cross sectional diagrams illustrating vertical etching states with a first transparent conductive material used as a mask according to the present invention.
Figure 9B:
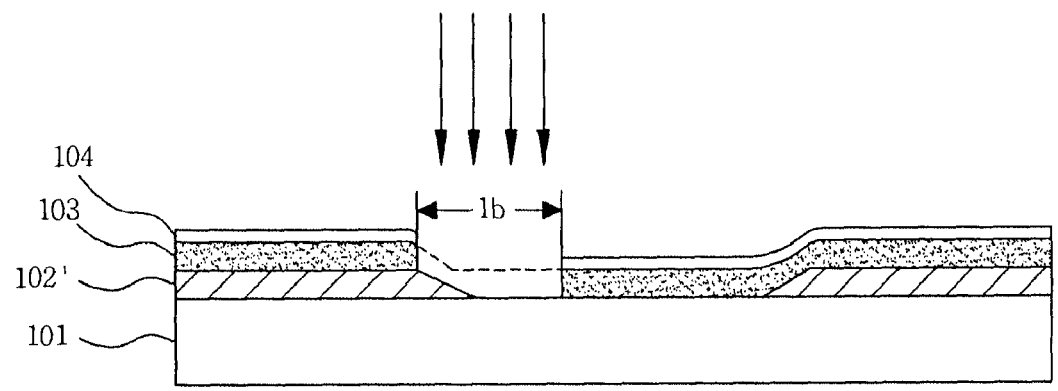

FIGS. 9A and 9B are cross sectional diagrams illustrating vertical etching states with the first transparent conductive material 104 used as a mask according to the present invention. Three etching methods can be used depending on a section shape of the conductive material 102.

In other words, as shown in FIGS. 9A and 9B, in case where conductive materials 102 and 102' have slant sections, the solar cell layer 103 is vertically etched using the deposited first transparent conductive material 104 of FIG. 7 as the mask. It is desirable to use a dry etching process such as Reactive Ion Etching (RIE).

Figure 9C:
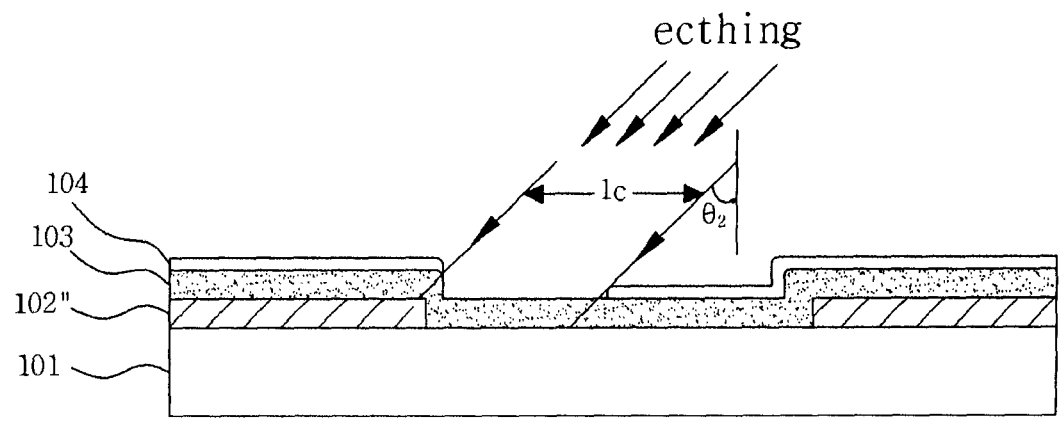
FIG. 9C is a cross sectional diagram illustrating a slant etching state with a first transparent conductive material used as a mask according to the present invention.

As shown in FIG. 9C, in case where a conductive material 102" has a vertical section, the solar cell layer 103 is etched on a slant with a predetermined angle ($\theta_2$) with respect to the substrate 101, using the deposited first transparent conductive material 104 of FIG. 7 as the mask.

Non-described symbols 1b and 1c denote regions in which the first transparent conductive material 104 is not deposited over the conductive material 102' or 102" having the slant section or the vertical section. The region represents a region for etching implemented in the following step.

This method can make it possible to minutely etch the solar cell layer 103 without needing a specific mask, thereby realizing the insulation gap of several μm to several tens of μm between the unit elements. This can reduce by more than tens of times to hundreds of times compared with conventional plasma-based chemical vaporization machining method and laser beam-based laser patterning method, thereby maximizing an effective area of the solar cell.

Figure 10A:
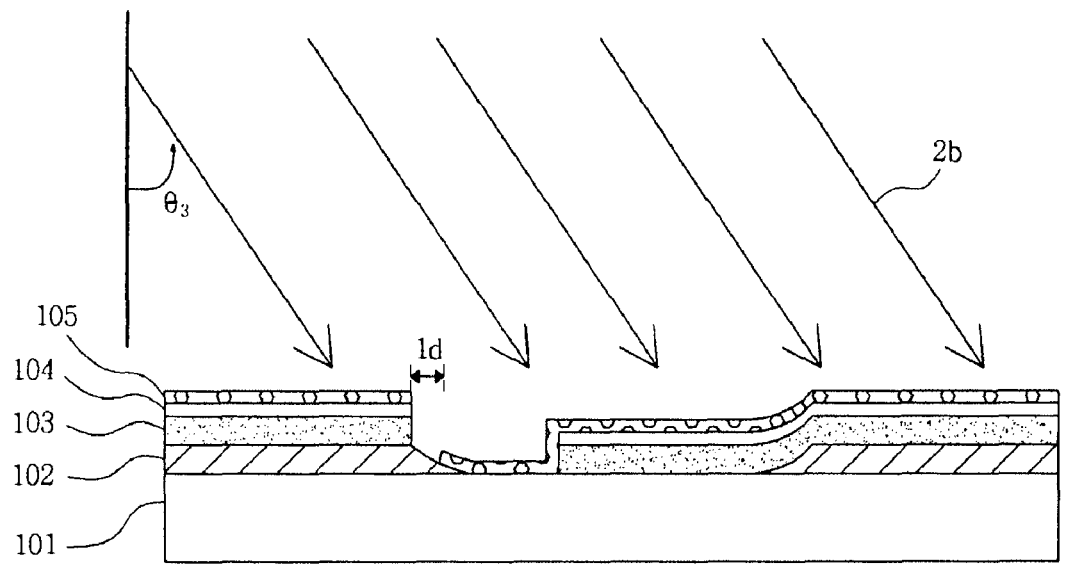
FIGS. 10A and 10B are cross sectional diagrams illustrating states where second transparent conductive materials are formed according to the present invention.
Figure 10B:
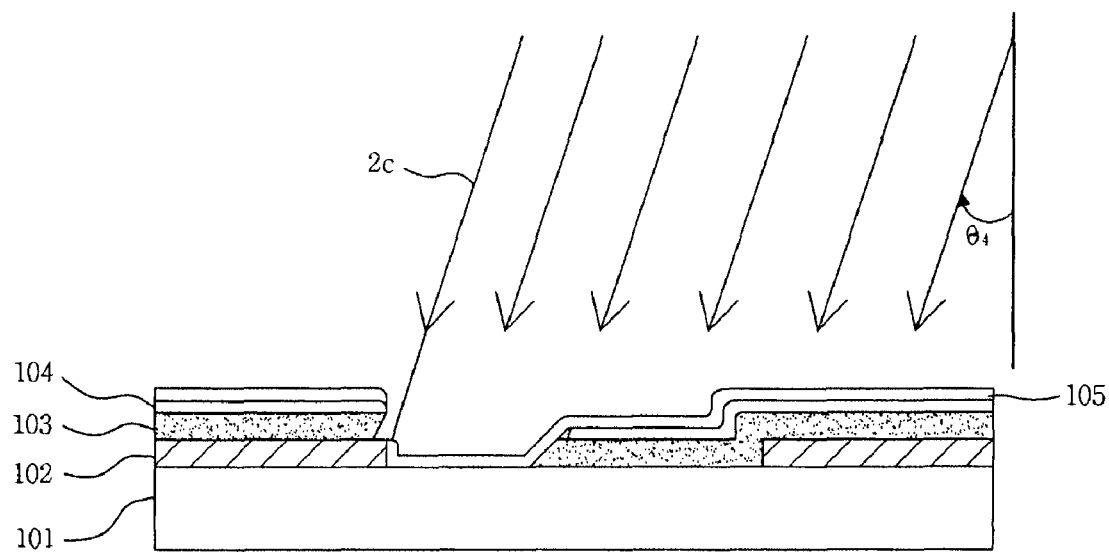

FIG. 10A illustrates a process of forming the second transparent conductive material 105 on the first transparent conductive material 104 of FIG. 9A. FIG. 10B illustrates a process of forming the second transparent conductive material 105 on the first transparent conductive material 104 of FIG. 9C. A process of forming the second transparent conductive material 105 on the first transparent conductive material 104 of FIG. 9B is the same as that of FIG. 10A and thus, its description will be omitted.

As shown in FIGS. 10A and 10B, the second transparent conductive material 105 is formed using the same deposition process as the first transparent conductive material 104 in a state where a predetermined insulating gap between unit elements is provided in a previous etching process.

When the second transparent conductive materials 105 are deposited on a slant with predetermined angle ($\theta_3$ and $\theta_4$) using an electron beam or thermal depositor, it is thinly deposited on the first transparent conductive material 104 excluding portions (1d) of the slant surfaces, owing to deposition straightness (2b and 2c).

The second transparent conductive material 105 is a transparent conductive material, and is at least one selected from the group consisting of zinc oxide (ZnO), tin oxide ($SnO_2$), and Indium Tin Oxide (ITO).

According to the above processes, the conductive material 102 of a left unit element and the second transparent conductive material 105 of a right unit element adjacent to the left unit element get in contact with each other, while the solar cell (semiconductor) layer 103 of the left unit element and the second transparent conductive material 105 of the right unit element electrically connect with each other in series between the unit elements.

Since the transparent conductive material is small in conductivity, a metal line electrode is desirably formed and patterned to be spaced a predetermined distance apart from each other after the second transparent conductive material 105 is deposited. By forming so, the transparent conductive material can be enhanced in conductivity. The metal line is to improve a low conductivity of the transparent conductive material. In case where the transparent conductive material is formed, the metal line can be additionally formed anytime.

The metal line uses a single metal with a high reflectivity such as aluminum (Al), argentums (Ag), and aurum (Au), a multi metal being a mixture of aluminum (Al)/argentums (Ag), or a metallic material that is any one or more selected from the group consisting of argentums (Ag), aluminum (Al), and aurum (Au).

These processes are implemented by self-alignment without needing a specific position control device. Thus, the integrated thin-film solar cell is manufactured using a simpler process.

(2) Integrated Solar Cell Formed by Two Slant Depositions on Conductive Substrate.

Figure 11:
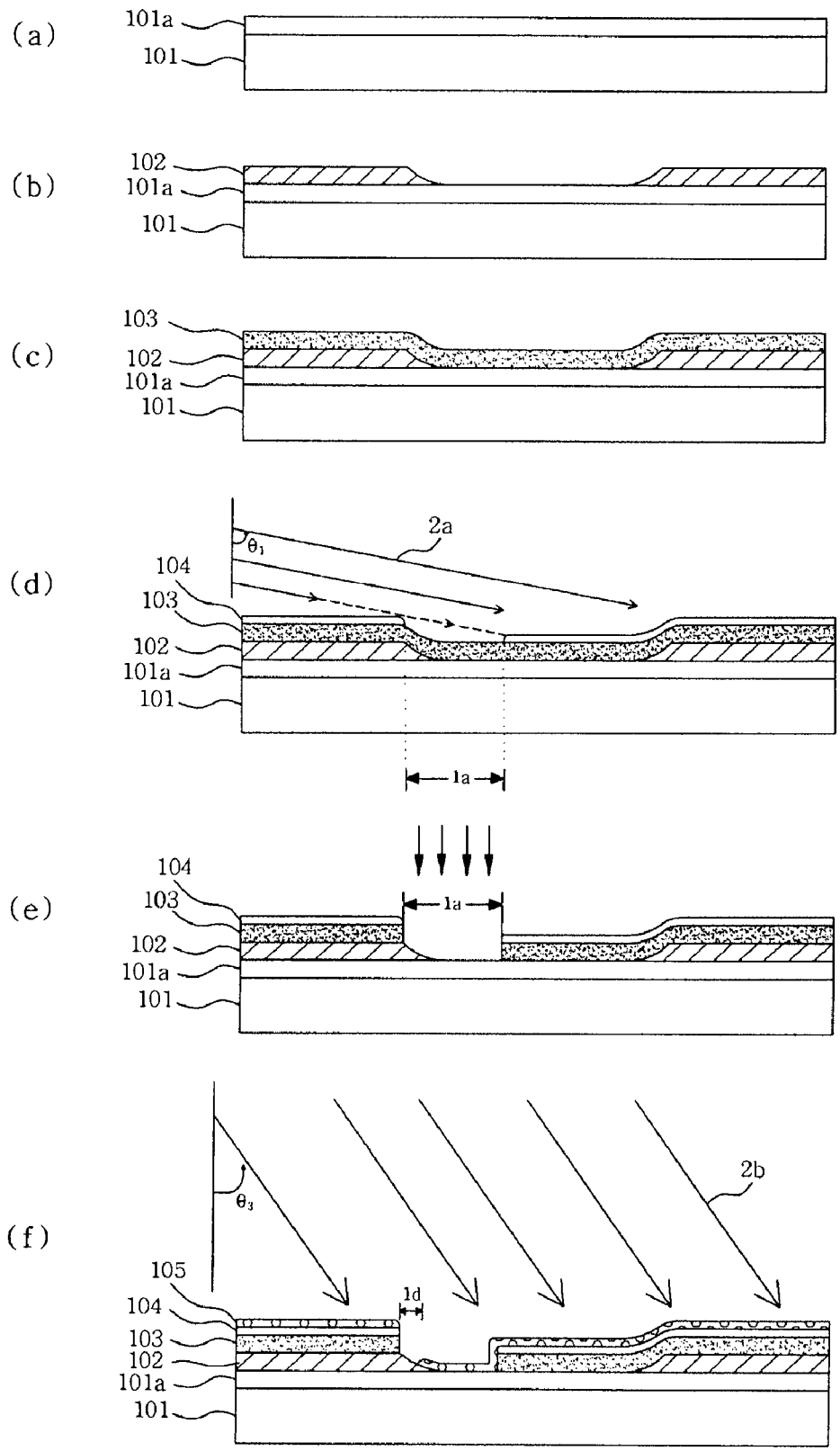
FIG. 11 is a cross sectional diagram illustrating a structure and a forming process of an integrated thin-film solar cell formed by two slant depositions on a conductive substrate according to another exemplary embodiment of the present invention.

FIG. 11 is a cross sectional diagram illustrating a structure and a forming process of an integrated thin-film solar cell formed by two slant depositions on a conductive substrate 101 according to another exemplary embodiment of the present invention.

In FIG. 11A, an insulating film 101a is formed on the conductive substrate 101. In FIG. 11B, a conductive material 102 is formed and patterned so that it is spaced a predetermined distance apart and insulated from each other on the insulating film 101a.

In FIG. 11C, a solar cell (semiconductor) layer 103 is formed on the substrate comprising the conductive material 102.

After a first transparent conductive material 104 is obliquely deposited on the solar cell layer 103 in FIG. 11D, the solar cell layer 103 is etched using the first transparent conductive material 104 as a mask in FIG. 11E.

In FIG. 11F, a second transparent conductive material 105 is obliquely deposited on the substrate comprising the etched solar cell layer 103 to connect with the conductive material 102, thereby electrically connecting the solar cells with each other in series.

As shown in FIG. 11F, the integrated thin-film solar cell according to the present invention is of a structure where the insulating film 101a, the conductive material 102, the solar cell (semiconductor) layer 103, the first transparent conductive material 104, and the second transparent conductive material 105 are sequentially layered on the conductive substrate 101.

In other words, the conductive material 102 is patterned to have an insulating gap for insulation from left/right adjacent conductive materials 102. The solar cell (semiconductor) layer 103 and the first transparent conductive material 104 are deposited on the patterned conductive material 102. The second transparent conductive material 105 formed on the first transparent conductive material 104 is of a structure in which it gets in contact with the adjacent conductive material 102 of one direction, thereby accomplishing electrical serial connection between unit elements.

The patterned conductive material 102 can have a slant section with a predetermined slope at its side portion. But, this is not intended to limit the scope of the present invention and thus, the patterned conductive material 102 can have a curved slant section or a section vertical with the substrate 101.

As shown in FIG. 11A, the insulating film 101a should be formed on the substrate 101 because the substrate 101 has a conductive property. Other detailed descriptions of forming relation and content of the solar cell are the same as in the "(1) Integrated solar cell formed by two slant depositions on insulating substrate" and thus, will be omitted.

(3) Integrated Solar Cell Formed by Three Slant Depositions on Insulating Substrate.

Figure 12:
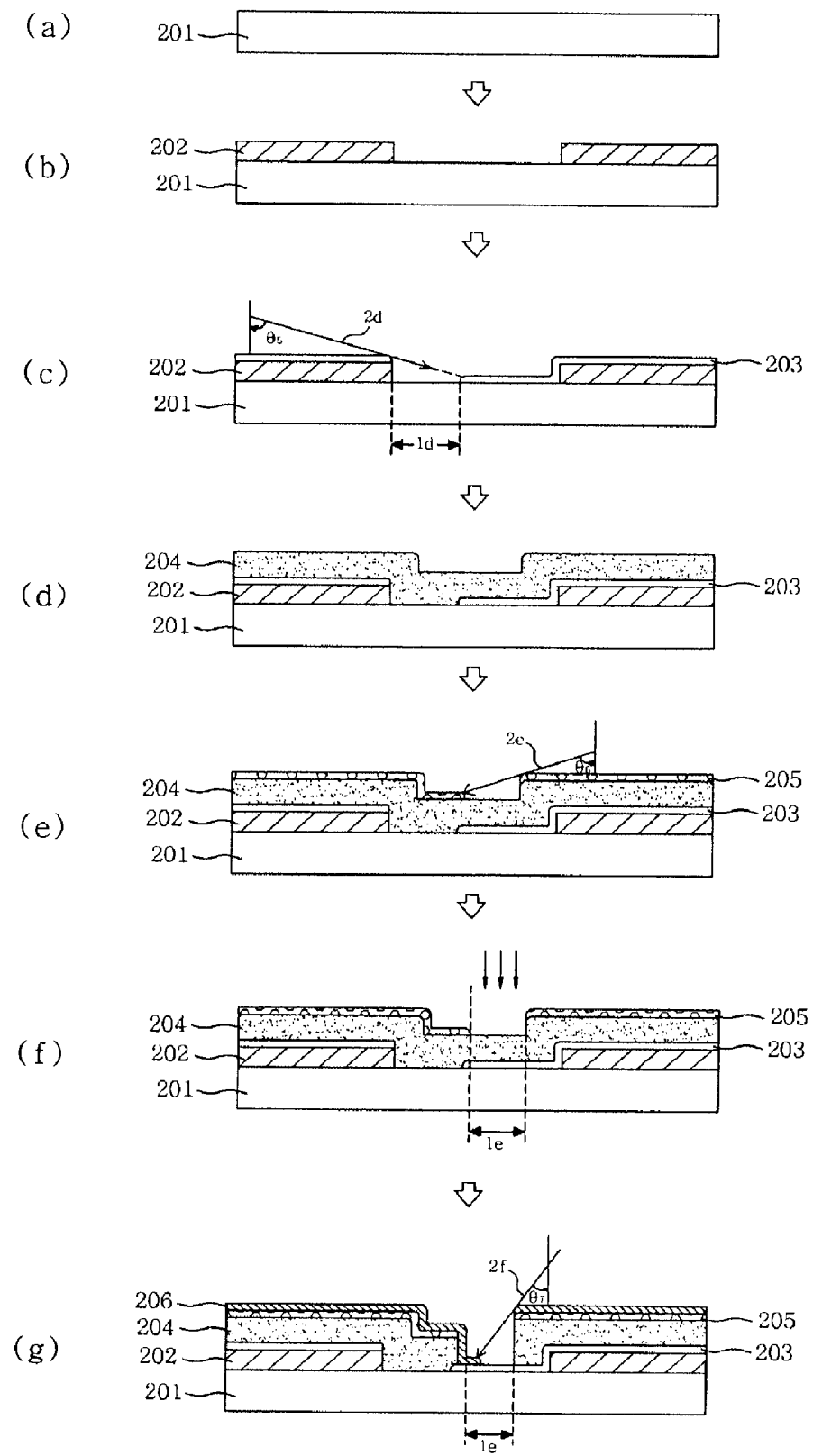
FIG. 12 is a cross sectional diagram illustrating a structure and a forming process of an integrated thin-film solar cell formed by three slant depositions on an insulating substrate according to a further another exemplary embodiment of the present invention.

FIG. 12 is a cross sectional diagram illustrating a structure and a forming process of an integrated thin-film solar cell formed by three slant depositions on an insulating substrate 201 according to a further another exemplary embodiment of the present invention.

In FIG. 12B, a first conductive material 202 is formed and patterned so that it is spaced a predetermined distance apart and insulated from each other on the insulating film 201.

In FIG. 12C, a second conductive material 203 is obliquely deposited on the substrate comprising the first conductive material 202.

In FIG. 12D, a solar cell (semiconductor) layer 204 is formed on the substrate comprising the second conductive material 203.

After a first transparent conductive material 205 is obliquely deposited on the solar cell layer 204 in FIG. 12E, the solar cell layer 204 is etched using the first transparent conductive material 205 as a mask in FIG. 12F.

In FIG. 12G, a second transparent conductive material 206 is obliquely deposited on the substrate comprising the etched solar cell layer 204 to connect with the second conductive material 203, thereby electrically connecting the solar cells with each other in series.

As shown in FIG. 12G, the integrated thin-film solar cell according to the present invention is of a structure where the first conductive material 202, the second conductive material 203, the solar cell (semiconductor) layer 204, the first transparent conductive material 205, and the second transparent conductive material 206 are sequentially layered on the insulating substrate 101.

In other words, the first conductive material 202 is patterned to have an insulating gap for insulation from left/right adjacent first conductive materials 202. The patterned first conductive material 202 can be vertical with the substrate 201 at its side portion as shown. But, this is not intended to limit the scope of the present invention and thus, the patterned first conductive material 202 can have a slant section with a predetermined slope or a curved slant section. The second transparent conductive material 206 formed on the first transparent conductive material 205 is of a structure in which it gets in contact with the adjacent second conductive material 203 of one direction, thereby accomplishing electrical serial connection between unit elements.

A method of manufacturing the integrated thin-film solar cell will be described in sequence as follows.

As shown in FIG. 12B, the patterned first conductive material 202 is formed on the insulating substrate 201 in a first process of the manufacturing method of the integrated thin-film solar cell according to the present invention.

The insulating substrate 201 is a transparent substrate or a non-transparent substrate.

The patterned first conductive material 202 is possible for all cases where surface prominence and depression is provided or not.

As shown in FIG. 12C, the second conductive material 203 is deposited on a slant with a fifth angle ($\theta_5$) on the substrate comprising the patterned first conductive material 202. When the second conductive material 203 is deposited by the fifth angle ($\theta_5$), it is thinly deposited on the first conductive material 202 excluding a one-side vertical surface of the first conductive material 202 and a portion (1a) caused by the fifth angle ($\theta_5$), owing to deposition straightness (2d).

The first and second conductive materials 202 and 203 use a transparent conductive material that is any one or more selected from the group consisting of zinc oxide (ZnO), tin oxide ($SnO_2$), and Indium Tin Oxide (ITO), a single metal with a high reflectivity such as aluminum (Al), argentums (Ag), and aurum (Au), a multi metal being a mixture of aluminum (Al)/argentums (Ag), or a metallic material that is any one or more selected from the group consisting of argentums (Ag), aluminum (Al), and aurum (Au).

In FIG. 12D illustrating a cross sectional diagram illustrating a state where the solar cell layer 204 is formed, the solar cell layer 204 is formed in compliance to a surface shape of the resultant comprising the above deposited second conductive material 203.

The solar cell can be any one or more of a silicon-based solar cell, a compound-based solar cell, an organic solar cell, a dry dye-sensitized solar cell, and an organic/inorganic complex solar cell.

Among them, the silicon-based solar cell is any one of an amorphous silicon (a-Si:H) single junction solar cell, an a-Si:H/a-Si:H or a-Si:H/a-Si:H/a-Si:H multi-junction solar cell, an amorphous silicon-germanium (a-SiGe:H) single junction solar cell, an a-Si:H/a-SiGe:H double junction solar cell, an a-Si:H/a-SiGe:H/a-SiGe:H triple junction solar cell, an amorphous silicon/microcrystalline (polycrystalline) silicon double junction solar cell, and a protocrystalline silicon solar cell.

In FIG. 12E illustrating a cross sectional diagram of a state where the first transparent conductive material 205 is formed, the first transparent conductive material 205 is obliquely deposited and formed on the above formed solar cell layer 204 using a deposition method such as electron beam or thermal deposition.

The first transparent conductive material 205 is a transparent conductive material, and is at least one selected from the group consisting of zinc oxide (ZnO), tin oxide ($SnO_2$), and Indium Tin Oxide (ITO).

Thus, when the first transparent conductive material 205 is deposited on a slant with a sixth angle ($\theta_6$) using an electron beam or thermal depositor, it is thinly deposited on the solar cell layer 204 excluding a one-side vertical surface of the solar cell layer 204 and a portion (1e) caused by the sixth angle ($\theta_6$), owing to deposition straightness (2e). The portion (1e) comprising such a slant surface represents a region for etching implemented in the following step.

FIG. 12F is a cross sectional diagram illustrating a vertical etching state with the first transparent conductive material 205 used as the mask.

The above method can make it possible to minutely etch the solar cell layer 204 without needing a specific mask, thereby realizing an insulation gap of several μm to several tens of μm between the unit elements. This can reduce by more than tens of times to hundreds of times compared with conventional plasma-based chemical vaporization machining method and laser beam-based laser patterning method, thereby maximizing an effective area of the solar cell.

Referring to FIG. 12G, the second transparent conductive material 206 is formed on the first transparent conductive material 205.

As shown in FIG. 12G, the second transparent conductive material 206 is formed using the same deposition process as the first transparent conductive material 205 in a state where a predetermined insulating gap between the unit elements is provided in a previous etching process.

In other words, when the second transparent conductive material 206 is deposited on a slant with a predetermined seventh angle ($\theta_7$) using an electron beam or thermal depositor, it is thinly deposited on the first transparent conductive material 205 excluding one-side vertical surfaces of the first transparent conductive material 205 and the solar cell layer 204 and a portion (1e) caused by the slant angle ($\theta_7$), owing to deposition straightness (2f).

The second transparent conductive material 206 is a transparent conductive material, and is at least one selected from the group consisting of zinc oxide (ZnO), tin oxide ($SnO_2$), and Indium Tin Oxide (ITO).

According to the above processes, the second transparent conductive material 206 of a left unit element and the second conductive material 203 of a right unit element adjacent to the left unit element get in contact with each other, thereby achieving electrical serial connection between the unit elements.

Since the transparent conductive material is small in conductivity, a metal line electrode is desirably formed and patterned to be spaced a predetermined distance apart from each other after the second transparent conductive material 206 is deposited. By forming so, the transparent conductive material can be enhanced in conductivity. The metal line is to improve a low conductivity of the transparent conductive material. In case where the transparent conductive material is formed, the metal line can be additionally formed anytime.

The metal line uses a single metal with a high reflectivity such as aluminum (Al), argentums (Ag), and aurum (Au), a multi metal being a mixture of aluminum (Al)/argentums (Ag), or a metallic material that is any one or more selected from the group consisting of argentums (Ag), aluminum (Al), and aurum (Au).

These processes are implemented by self-alignment without needing a specific position control device. Thus, the integrated thin-film solar cell is manufactured using a simpler process.

A method for patterning the conductive material on the substrate and other detailed descriptions of forming relation and content are the same as in the "(1) Integrated solar cell formed by two slant depositions on insulating substrate" and thus, will be omitted.

(4) Integrated Solar Cell Formed by Three Slant Depositions on Insulating Substrate.

Figure 13:
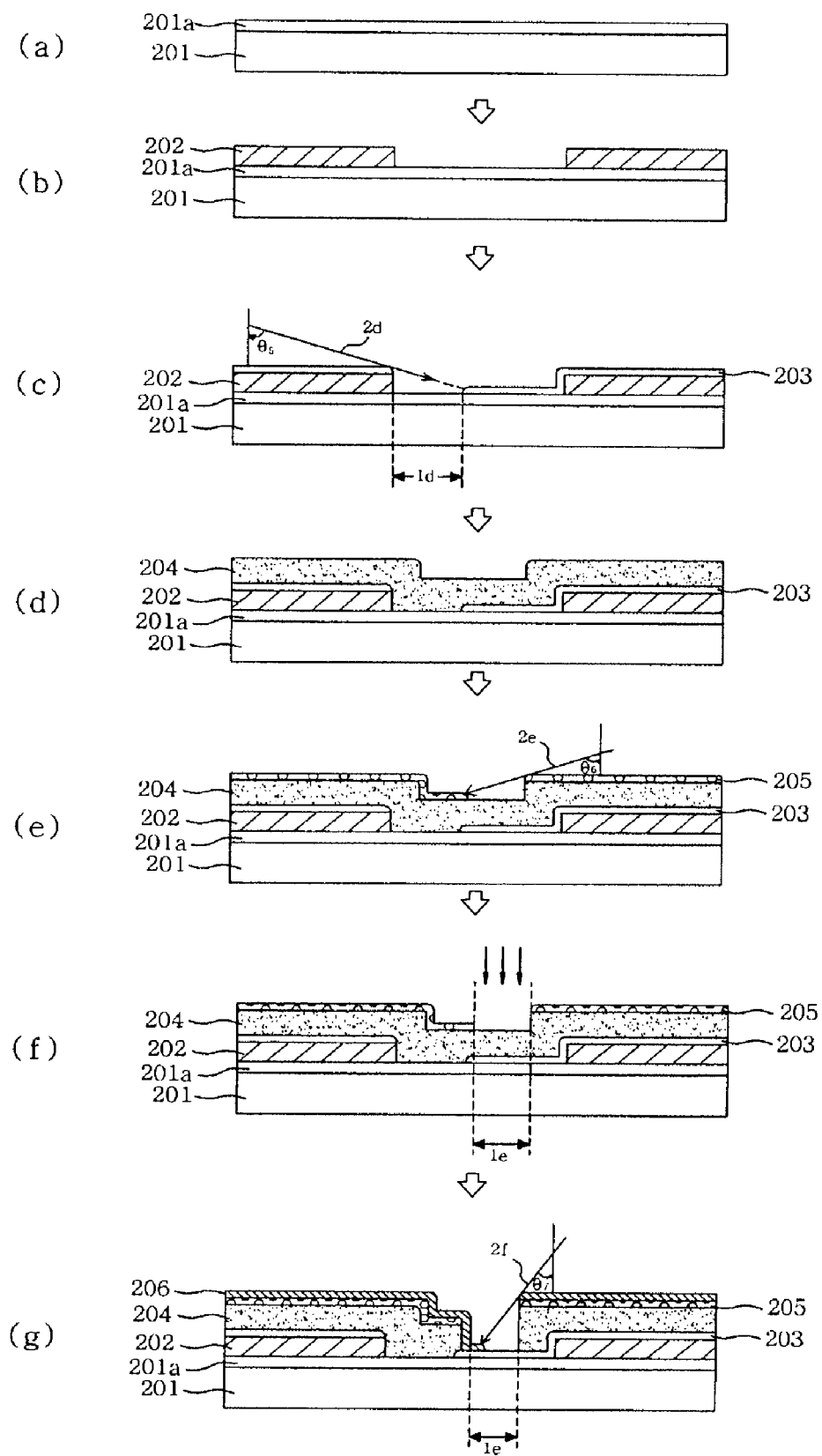
FIG. 13 is a cross sectional diagram illustrating a structure and a forming process of an integrated thin-film solar cell formed by three slant depositions on a conductive substrate according to a still another exemplary embodiment of the present invention.

FIG. 13 is a cross sectional diagram illustrating a structure and a forming process of an integrated thin-film solar cell formed by three slant depositions on a conductive substrate 201 according to a still another exemplary embodiment of the present invention.

In FIG. 13A, an insulating film 201a is formed on the conductive substrate 201.

In FIG. 13B, a first conductive material 202 is formed and patterned so that it is spaced a predetermined distance apart and insulated from each other on the insulating film 201a.

In FIG. 13C, a second conductive material 203 is obliquely deposited on the substrate comprising the formed first conductive material 202.

In FIG. 13D, a solar cell (semiconductor) layer 204 is formed on the substrate comprising the deposited second conductive material 203.

After a first transparent conductive material 205 is obliquely deposited on the solar cell layer 204 in FIG. 13E, the solar cell layer 204 is etched using the first transparent conductive material 205 as a mask in FIG. 13F.

In FIG. 13G, a second transparent conductive material 206 is obliquely deposited on the substrate comprising the etched solar cell layer 204 to connect with the second conductive material 203, thereby electrically connecting the solar cells with each other in series.

As shown in FIG. 13G, the integrated thin-film solar cell according to the present invention is of a structure where the insulating film 201a, the first conductive material 202, the second conductive material 203, the solar cell (semiconductor) layer 204, the first transparent conductive material 205, and the second transparent conductive material 206 are sequentially layered on the conductive substrate 201.

In other words, the first conductive material 202 is patterned to have an insulating gap for insulation from left/right adjacent first conductive materials 202. The patterned first conductive material 202 can be vertical with the substrate 201 at its side portion as shown in FIG. 13G. But, this is not intended to limit the scope of the present invention and thus, the patterned first conductive material 202 can have a slant section with a predetermined slope or a curved slant section.

The second transparent conductive material 206 formed on the first transparent conductive material 205 is of a structure in which it gets in contact with the adjacent second conductive material 203 of one direction, thereby accomplishing electrical serial connection between unit elements.

As shown in FIG. 13A, the insulating film 201a should be formed on the substrate 201 because the substrate 201 has a conductive property. Other detailed descriptions of forming relation and content are the same as in the "(3) Integrated solar cell formed by three slant depositions on insulating substrate" and thus, will be omitted.

(5) Integrated Solar Cell Formed by Three Slant Depositions on Insulating Substrate with Patterned Prominence and Depression Surface.

Figure 14:
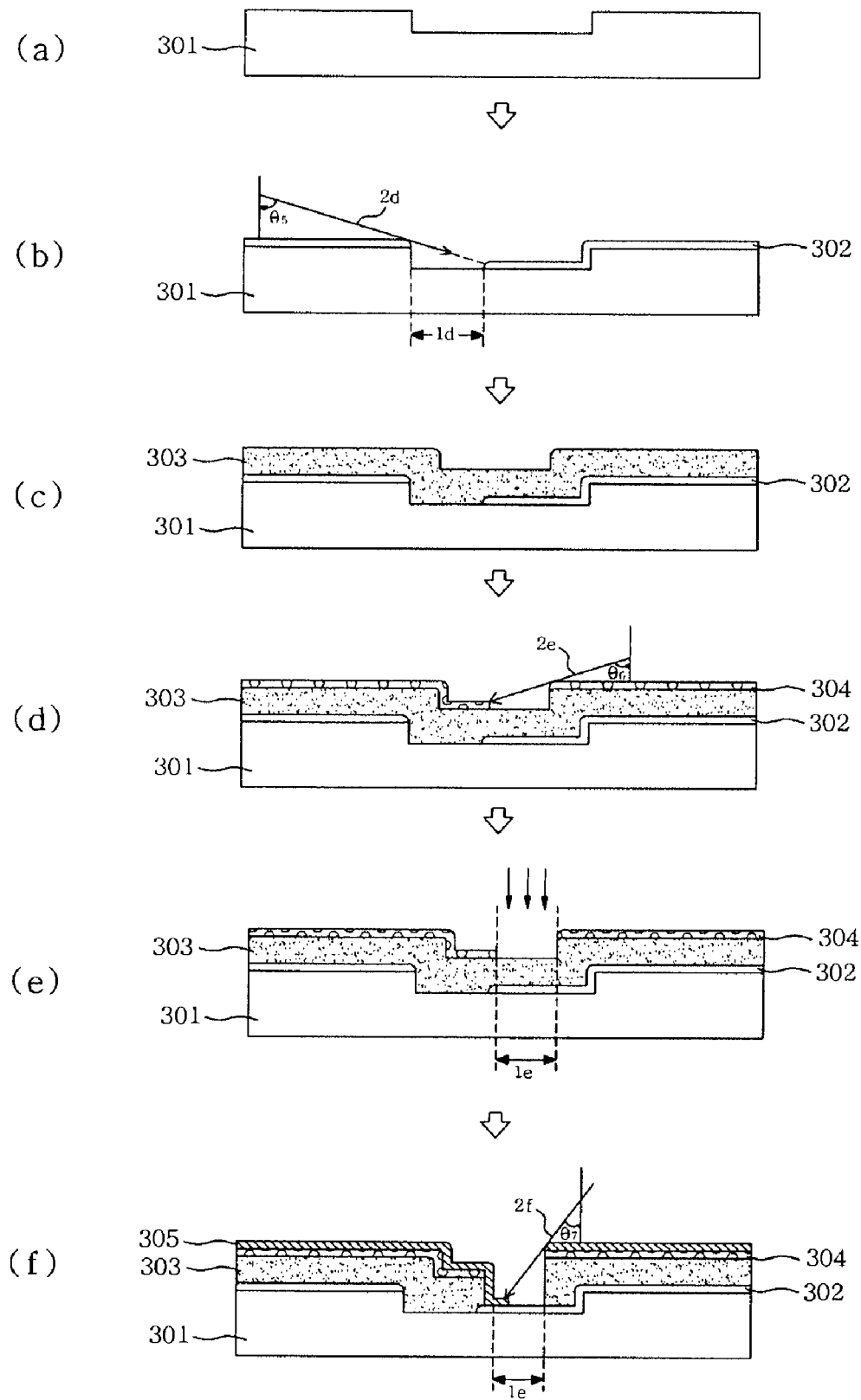
FIG. 14 is a cross sectional diagram illustrating a structure and a forming process of an integrated thin-film solar cell formed by three slant depositions on an insulating substrate with prominence and depression according to a yet another exemplary embodiment of the present invention.

FIG. 14 is a cross sectional diagram illustrating a structure and a forming process of an integrated thin-film solar cell formed by three slant depositions on an insulating substrate 301 with patterned prominence and depression surface according to a yet another exemplary embodiment of the present invention.

In FIG. 14B, a conductive material 302 is obliquely deposited on the insulating substrate 301 with prominence and depression.

In FIG. 14C, a solar cell (semiconductor) layer 303 is formed on the substrate comprising the conductive material 302.

After a first transparent conductive material 304 is obliquely deposited on the solar cell layer 303 in FIG. 14D, the solar cell layer 303 is etched using the first transparent conductive material 304 as a mask in FIG. 14E.

In FIG. 14F, a second transparent conductive material 305 is obliquely deposited on the substrate comprising the etched solar cell layer 303 to connect with the conductive material 302, thereby electrically connecting the solar cells with each other in series.

As shown in FIG. 14F, the integrated thin-film solar cell according to the present invention is of a structure where the conductive material 302, the solar cell (semiconductor) layer 303, the first transparent conductive material 304, and the second transparent conductive material 305 are sequentially layered on the insulating substrate 301 with the patterned prominence and depression surface.

A side portion of prominence and depression can be vertical with the patterned prominence and depression surface of in the insulating substrate 301. But, this is not intended to limit the scope of the present invention and thus, the side portion can have a slant section with a predetermined slope or a curved slant section.

The second transparent conductive material 305 formed on the first transparent conductive material 304 is of a structure in which it gets in contact with the adjacent conductive material 302 of one direction, thereby accomplishing electrical serial connection between unit elements.

A method of manufacturing the integrated thin-film solar cell will be described in sequence as follows.

As shown in FIG. 14B, the conductive material 302 is deposited on a slant with a fifth angle ($\theta_5$) on the insulating substrate 301 with the prominence and depression in a first process of the manufacturing method of the integrated thin-film solar cell according to the present invention. When the conductive material 302 is deposited by the fifth angle ($\theta_5$), it is thinly deposited on the insulating substrate 301 excluding a one-side vertical surface of the substrate 301 with the prominence and depression and a portion (1d) caused by the fifth angle ($\theta_5$), owing to deposition straightness (2d).

The conductive material 302 uses a transparent conductive material that is any one or more selected from the group consisting of zinc oxide (ZnO), tin oxide (SnO$_2$), and Indium Tin Oxide (ITO), a single metal with a high reflectivity such as aluminum (Al), argentums (Ag), and aurum (Au), a multi metal being a mixture of aluminum (Al)/argentums (Ag), or a metallic material that is any one or more selected from the group consisting of argentums (Ag), aluminum (Al), and aurum (Au).

In FIG. 14C illustrating a cross sectional diagram illustrating a state where the solar cell layer 303 is formed, the solar cell layer 303 is formed in compliance to a surface shape of the resultant comprising the above deposited conductive material 302.

The solar cell can be any one or more of a silicon-based solar cell, a compound-based solar cell, an organic solar cell, and a dry dye-sensitized solar cell.

Among them, the silicon-based solar cell is any one of an amorphous silicon (a-Si:H) single junction solar cell, an a-Si:H/a-Si:H or a-Si:H/a-Si:H/a-Si:H multi-junction solar cell, an amorphous silicon-germanium (a-SiGe:H) single junction solar cell, an a-Si:H/a-SiGe:H double junction solar cell, an a-Si:H/a-SiGe:H/a-SiGe:H triple junction solar cell, an amorphous silicon/microcrystalline (polycrystalline) silicon double junction solar cell, and a protocrystalline silicon solar cell.

In FIG. 14D illustrating a cross sectional diagram of a state where the first transparent conductive material 304 is formed, the first transparent conductive material 304 is obliquely deposited and formed on the above formed solar cell layer 303 using a deposition method such as electron beam or thermal deposition.

The first transparent conductive material 304 is a transparent conductive material, and is at least one selected from the group consisting of zinc oxide (ZnO), tin oxide (SnO$_2$), and Indium Tin Oxide (ITO).

Thus, when the first transparent conductive material 304 is deposited on a slant with a sixth angle ($\theta_6$) using an electron beam or thermal depositor as shown in FIG. 14D, it is thinly deposited on the solar cell layer 303 excluding a one-side vertical surface of the solar cell layer 303 and a portion (1e) caused by the sixth angle ($\theta_6$), owing to deposition straightness (2e). The portion (1e) comprising such a slant surface represents a region for etching implemented in the following step.

FIG. 14E is a cross sectional diagram illustrating a vertical etching state with the first transparent conductive material 304 used as the mask.

The above method can make it possible to minutely etch the solar cell layer 303 without needing a specific mask, thereby realizing an insulation gap of several μm to several tens of μm between the unit elements. This can reduce by more than tens of times to hundreds of times compared with conventional plasma-based chemical vaporization machining method and laser beam-based laser patterning method, thereby maximizing an effective area of the solar cell.

Referring to FIG. 14F, the second transparent conductive material 305 is formed on the first transparent conductive material 304.

As shown in FIG. 14F, the second transparent conductive material 305 is formed using the same deposition process as the first transparent conductive material 304 in a state where a predetermined insulating gap between the unit elements is provided in a previous etching process.

In other words, when the second transparent conductive material 305 is deposited on a slant with a predetermined seventh angle ($\theta_7$) using an electron beam or thermal depositor, it is thinly deposited on the first transparent conductive material 304 excluding a one-side vertical surface of the solar cell layer 303 and a portion (1e) caused by the slant angle ($\theta_7$), owing to deposition straightness (2f).

The second transparent conductive material 305 is a transparent conductive material, and is at least one selected from the group consisting of zinc oxide (ZnO), tin oxide (SnO$_2$), and Indium Tin Oxide (ITO).

According to the above processes, the second transparent conductive material 305 of a left unit element and the conductive material 302 of a right unit element adjacent to the left unit element get in contact with each other, thereby achieving electrical serial connection between the unit elements.

Since the transparent conductive material is small in conductivity, a metal line electrode is desirably formed and patterned to be spaced a predetermined distance apart from each other after the second transparent conductive material 305 is deposited. By forming so, the transparent conductive material can be enhanced in conductivity. The metal line is to improve a low conductivity of the transparent conductive material. In case where the transparent conductive material is formed, the metal line can be additionally formed anytime.

The metal line uses a single metal with a high reflectivity such as aluminum (Al), argentums (Ag), and aurum (Au), a multi metal being a mixture of aluminum (Al)/argentums (Ag), or a metallic material that is any one or more selected from the group consisting of argentums (Ag), aluminum (Al), and aurum (Au).

These processes are implemented by self-alignment without needing a specific position control device. Thus, the integrated thin-film solar cell is manufactured using a simpler process.

Desirably, the substrate with the prominence and depression is formed by applying a hot-embossing method to a flat substrate.

A method for patterning the conductive material on the substrate and other detailed descriptions of forming relation and content are the same as in the "(1) Integrated solar cell formed by two slant depositions on insulating substrate" and thus, will be omitted.

(6) Integrated Solar Cell Formed by Three Slant Depositions on Conductive Substrate with Patterned Prominence and Depression Surface.

Figure 15:
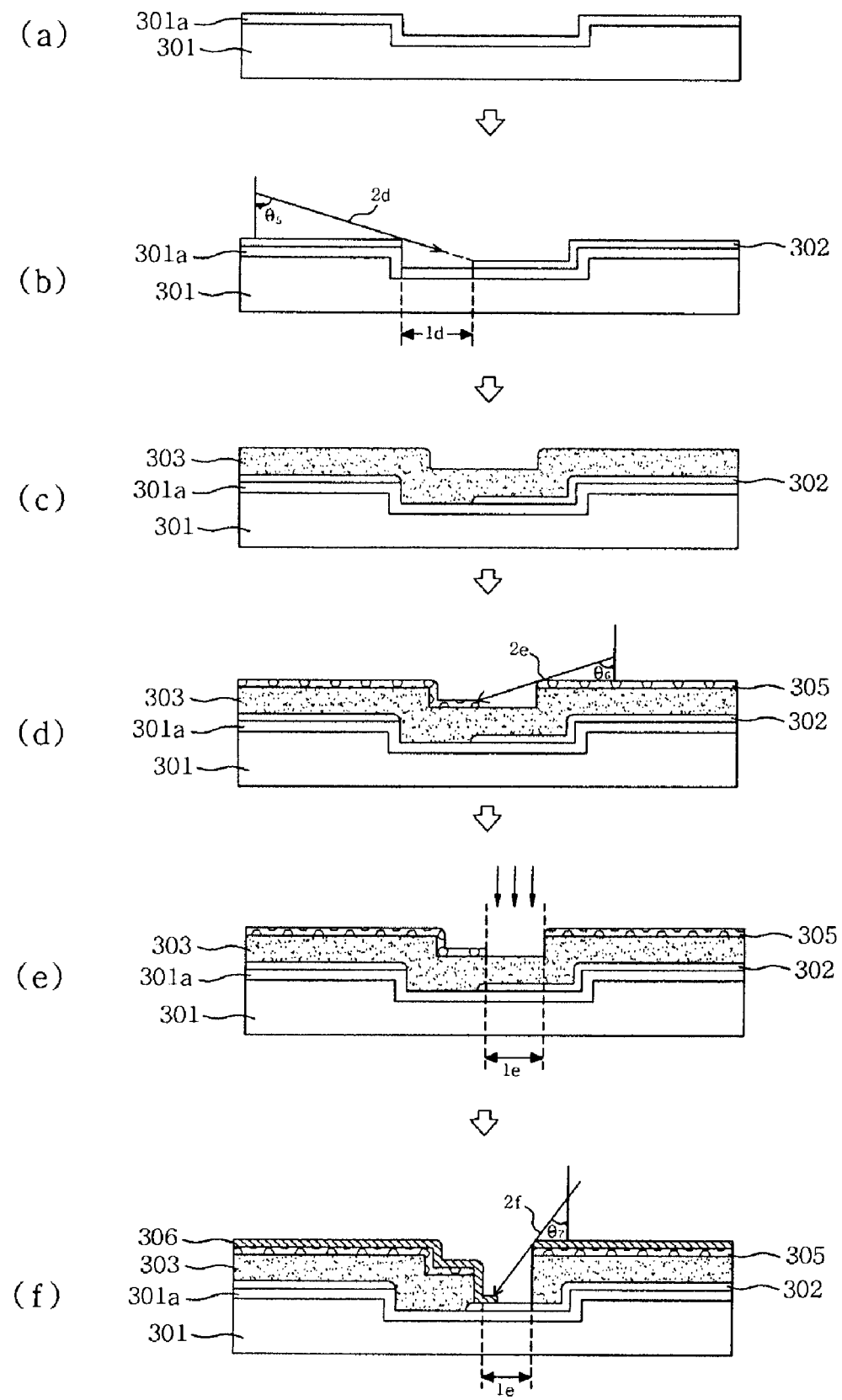
FIG. 15 is a cross sectional diagram illustrating a structure and a forming process of an integrated thin-film solar cell formed by three slant depositions on a conductive substrate with prominence and depression according to a yet another exemplary embodiment of the present invention.

FIG. 15 is a cross sectional diagram illustrating a structure and a forming process of an integrated thin-film solar cell formed by three slant depositions on a conductive substrate 301 with patterned prominence and depression surface according to a yet another exemplary embodiment of the present invention.

In FIG. 15A, an insulating film 301a is formed on the conductive substrate 101.

In FIG. 15B, a conductive material 302 is formed and patterned so that it is spaced a predetermined distance apart and insulated from each other on the insulating film 301a.

In FIG. 15C, a solar cell (semiconductor) layer 303 is formed on the substrate comprising the conductive material 302.

After a first transparent conductive material 304 is obliquely deposited on the solar cell layer 303 in FIG. 15D, the solar cell layer 303 is etched using the first transparent conductive material 304 as a mask in FIG. 15E.

In FIG. 15F, a second transparent conductive material 305 is obliquely deposited on the substrate comprising the etched solar cell layer 303 to connect with the conductive material 302, thereby electrically connecting the solar cells with each other in series.

As shown in FIG. 15F, the integrated thin-film solar cell according to the present invention is of a structure where the conductive material 302, the solar cell (semiconductor) layer 303, the first transparent conductive material 304, and the second transparent conductive material 305 are sequentially layered on the conductive substrate 301.

A side portion of prominence and depression can be vertical with the patterned prominence and depression surface of in the conductive substrate 301. But, this is not intended to limit the scope of the present invention and thus, the side portion can have a slant section with a predetermined slope or a curved slant section.

The second transparent conductive material 305 formed on the first transparent conductive material 304 is of a structure in which it gets in contact with the adjacent conductive material 302 of one direction, thereby accomplishing electrical serial connection between unit elements.

Excepting that the insulating film 301a is formed on the conductive substrate 301 as shown in FIG. 15A, other detailed descriptions of forming relation and content are the same as in the "(5) Integrated solar cell formed by three slant depositions on insulating substrate with prominence and depression" and thus, will be omitted.

(7) Integrated Solar Cell Formed by Three Slant Depositions on Transparent Substrate.

In case where a transparent substrate is used according to another exemplary embodiment of the present invention, a forming relation of a structure of an integrated thin-film solar cell based on three slant depositions will be described with reference to FIG. 12.

In FIG. 12, a transparent electrode 202 is formed and patterned so that it is spaced a predetermined distance apart and insulated from each other on the transparent substrate 201.

A transparent conductive material 203 is obliquely deposited on the substrate comprising the transparent electrode 202.

A solar cell (semiconductor) layer 204 is formed on the substrate comprising the deposited transparent conductive material 203.

Metal is obliquely deposited on the solar cell layer 204, thereby forming a first metal back electrode 205. After that, the solar cell layer 204 is etched using the first metal back electrode 205 as a mask.

Metal is obliquely deposited on the substrate comprising the etched solar cell layer 204 to form and connect a second metal back electrode 206 with the transparent conductive material 203, thereby electrically connecting the solar cells with each other in series.

As shown in FIG. 12G, the integrated thin-film solar cell according to the present invention is of a structure where the transparent electrode 202, the transparent conductive material 203, the solar cell (semiconductor) layer 204, the first metal back electrode 205, and the second metal back electrode 206 are sequentially layered on the transparent substrate 201.

In other words, the transparent electrode 202 is patterned to have an insulating gap for insulation from left/right adjacent transparent electrodes 202. The patterned transparent electrode 202 can be vertical with the substrate 201 at its side portion as shown. But, this is not intended to limit the scope of the present invention and thus, the patterned transparent electrode 202 can have a slant section with a predetermined slope or a curved slant section.

The second metal back electrode 206 formed on the first metal back electrode 205 is of a structure in which it gets in contact with the adjacent transparent conductive material 203 of one direction, thereby accomplishing electrical serial connection between unit elements.

Other detailed descriptions of forming relation and content are the same as in the "(3) Integrated solar cell formed by three slant depositions on insulating substrate" and thus, will be omitted.

However, the first conductive material, the second conductive material, the first transparent conductive material, and the second transparent conductive material in FIG. 12 illustrating the "integrated thin-film solar cell formed by three slant depositions on insulating substrate" correspond to the transparent electrode, the transparent conductive material, the first metal back electrode, and the second metal back electrode in the "integrated thin-film solar cell formed by three slant depositions on transparent substrate," respectively.

The transparent electrode and the transparent conductive material are a transparent conductive material, and is at least one selected from the group consisting of zinc oxide (ZnO), tin oxide ($SnO_2$), and Indium Tin Oxide (ITO).

The first metal back electrode and the second metal back electrode are a single metal with a high reflectivity such as aluminum (Al), argentums (Ag), and aurum (Au), a multi metal being a mixture of aluminum (Al)/argentums (Ag), or a metallic material that is any one or more selected from the group consisting of argentums (Ag), aluminum (Al), and aurum (Au).

(8) Integrated Solar Cell Formed by Three Slant Depositions on Transparent Substrate with Patterned Prominence and Depression Surface.

In case where a transparent substrate is used according to another exemplary embodiment of the present invention, a forming relation of a structure of an integrated thin-film solar cell based on three slant depositions will be described with reference to FIG. 14.

A transparent conductive material 302 is obliquely deposited on a transparent substrate 301 with a patterned prominence and depression surface.

A solar cell (semiconductor) layer 303 is formed on the substrate comprising the deposited transparent conductive material 302.

Metal is obliquely deposited on the solar cell layer 303, thereby forming a first metal back electrode 304. After that, the solar cell layer 303 is etched using the first metal back electrode 304 as a mask.

Metal is obliquely deposited on the substrate comprising the etched solar cell layer 303 to form and connect a second metal back electrode 305 with the transparent conductive material 302, thereby electrically connecting the solar cells with each other in series.

As shown in FIG. 14F, the integrated thin-film solar cell according to the present invention is of a structure where the transparent conductive material 302, the solar cell (semiconductor) layer 303, the first metal back electrode 304, and the second metal back electrode 305 are sequentially layered on the transparent substrate 301.

A side portion of prominence and depression can be vertical with the patterned prominence and depression surface of in the transparent substrate 301. But, this is not intended to limit the scope of the present invention and thus, the side portion can have a slant section with a predetermined slope or a curved slant section.

The second metal back electrode 305 formed on the first metal back electrode 304 is of a structure in which it gets in contact with the adjacent transparent conductive material 302 of one direction, thereby accomplishing electrical serial connection between unit elements.

Other detailed descriptions of forming relation and content are the same as in the "(5) Integrated solar cell formed by three slant depositions on insulating substrate with patterned prominence and depression surface" and thus, will be omitted.

However, the conductive material, the first transparent conductive material, and the second transparent conductive material in the "(5) integrated thin-film solar cell formed by three slant depositions on insulating substrate with patterned prominence and depression surface" correspond to the transparent conductive material, the first metal back electrode, and the second metal back electrode in the "integrated thin-film solar cell formed by three slant depositions on transparent substrate," respectively.

The transparent electrode and the transparent conductive material are a transparent conductive material, and is at least one selected from the group consisting of zinc oxide (ZnO), tin oxide ($SnO_2$), and Indium Tin Oxide (ITO).

The first metal back electrode and the second metal back electrode are a single metal with a high reflectivity such as aluminum (Al), argentums (Ag), and aurum (Au), a multi metal being a mixture of aluminum (Al)/argentums (Ag), or a metallic material that is any one or more selected from the group consisting of argentums (Ag), aluminum (Al), and aurum (Au).

As described above, the present invention has an effect that the insulation gap between the unit elements of the integrated thin-film solar cell can reduce by tens of times to hundreds of times compared with the conventional laser patterning and chemical vaporization machining method, thereby maximizing the effective area of the solar cell and thus, improving a performance of the unit cell of the solar cell.

Also, the present invention has an effect that a self alignment is possible, thereby making a precision position control unit unnecessary, and the printing method is used at the time of machining the transparent electrode, thereby making an expensive equipment such as a laser and a precision position control system unnecessary and thus, reducing the manufacturing cost, and the unit cell can be prevented from being deteriorated in performance due to its exposure to the atmosphere because all processes after the forming of the transparent electrode are performed under vacuum.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of manufacturing an integrated thin-film solar cell, the method comprising:

forming and patterning a first conductive material to have a prominence and a depression adjacently spaced a predetermined distance apart from each other on a substrate;

forming a solar cell layer on an entire surface of a resultant substrate;

obliquely depositing a second conductive material on the solar cell layer so that one or more portions of a top surface of the solar cell layer remain exposed;

etching the exposed portion of the solar cell layer using the second conductive material as a mask; and obliquely depositing a third conductive material on the resultant substrate so that the first conductive material and the second conductive material adjacent to the first conductive material are electrically connected by the third conductive material.

2. The method of claim 1, wherein at least one of the first conductive material, the second conductive material and the third conductive material is a transparent conductive material or a metallic material.

3. The method of claim 1, wherein the depositing of the second conductive material further comprises: forming and patterning metal electrodes to be spaced a predetermined distance apart from each other.

4. The method of claim 1, wherein the forming of the first conductive material further comprises:

thinly forming the first conductive material on the substrate;

coating and forming a pattern of photoresist or polymer band to be spaced a predetermined distance apart on the first conductive material by a printing method;

etching the first conductive material using the coated photoresist or polymer pattern as a mask; and removing the photoresist or polymer pattern.

5. The method of claim 4, wherein the first conductive material is etched in an isotropic etching method to have a curved slant section as an etching section.

6. The method of claim 4, wherein the first conductive material is mesa etched to have a slant section.

7. The method of claim 4, wherein the first conductive material is etched in an anisotropic etching method so that etching is performed in a vertical direction of the substrate.

8. The method of claim 5, wherein the solar cell layer is etched in a vertical direction.

9. The method of claim 6, wherein the solar cell layer is etched in a vertical direction.

10. The method of claim 7, wherein the solar cell layer is obliquely etched in a slant direction.

11. The method of claim 1, wherein the substrate is a substrate with an insulating film formed on a conductive substrate, or an insulating substrate.

12. An integrated thin-film solar cell whose unit elements are electrically connected in series by the method of claim 1.

* * * * *